(12) United States Patent
Miyoshi et al.

(10) Patent No.: US 6,576,375 B1
(45) Date of Patent: Jun. 10, 2003

(54) PHOTOMASK

(75) Inventors: Seiro Miyoshi, Yokohama (JP); Tsukasa Azuma, Tokyo (JP); Hideyuki Kanemitsu, Kawasaki (JP)

(73) Assignees: Kabushiki Kaisha Toshiba, Kawasaki (JP); Fujitsu Limited, Kawasaki (JP)

( * ) Notice: Subject to any disclaimer, the term of this patent is extended or adjusted under 35 U.S.C. 154(b) by 39 days.

(21) Appl. No.: 09/671,678

(22) Filed: Sep. 28, 2000

(30) Foreign Application Priority Data

Sep. 28, 1999 (JP) ............................................. 11-274722

(51) Int. Cl.$^7$ ................................................. G03F 9/00
(52) U.S. Cl. ............................................................ 430/5
(58) Field of Search ................................. 430/5; 428/14

(56) References Cited

U.S. PATENT DOCUMENTS

| | | | | |
|---|---|---|---|---|
| 4,166,148 A | * | 8/1979 | Sakurai | 428/332 |
| 5,422,206 A | * | 6/1995 | Kamon | 430/5 |
| 5,674,624 A | * | 10/1997 | Miyazaki et al. | 428/422 |
| 6,280,885 B1 | * | 8/2001 | Gordon | 430/5 |

* cited by examiner

*Primary Examiner*—Mark F. Huff
*Assistant Examiner*—Saleha R. Mohamedulla
(74) *Attorney, Agent, or Firm*—Finnegan, Henderson, Farabow, Garrett & Dunner, L.L.P.

(57) ABSTRACT

A photomask comprises a transparent substrate, a anti-reflection structure having a chromium oxide film, a chromium film and a chromium oxide film laminated in order on the major surface of the transparent substrate, an LiF film as a anti-reflection film formed on the surface of the first chromium oxide and at the interface between the chromium oxide film and the transparent substrate, and a spin-on-glass film formed on the surface of the chromium oxide film.

17 Claims, 7 Drawing Sheets

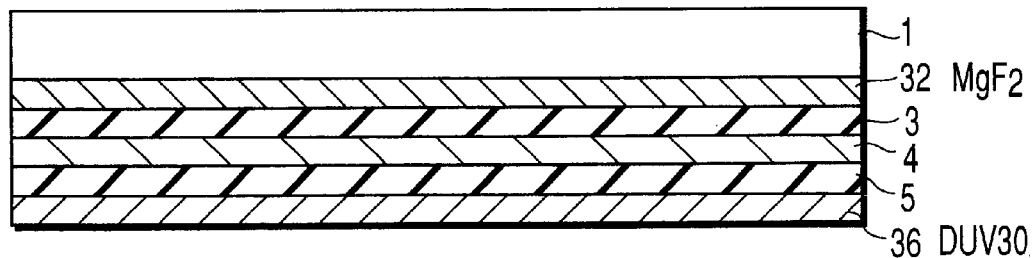
F I G. 5A
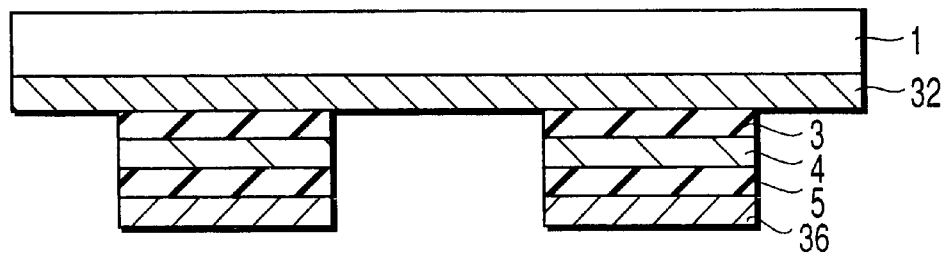
F I G. 5B

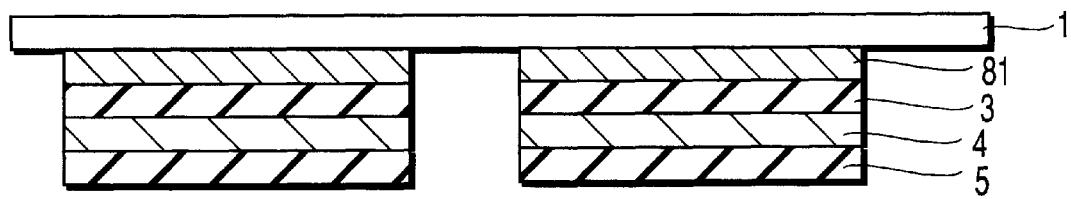
F I G. 8A
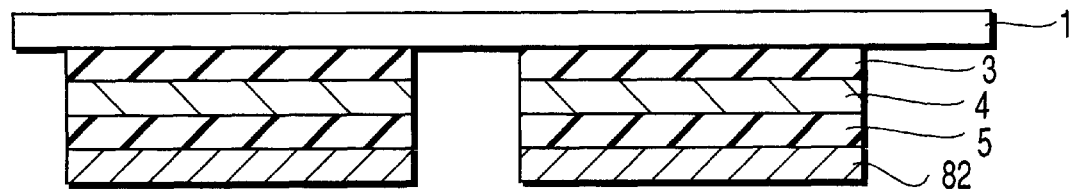
F I G. 8B
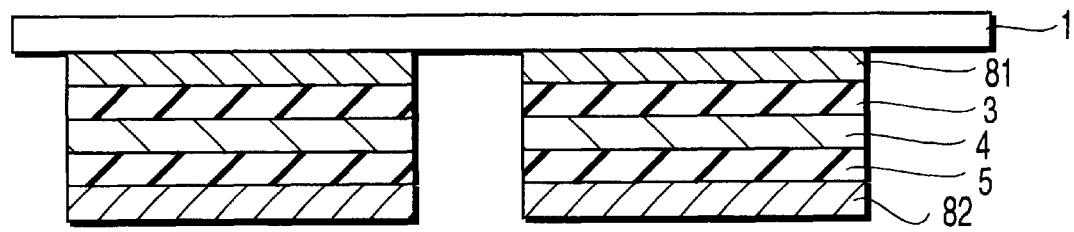
F I G. 8C
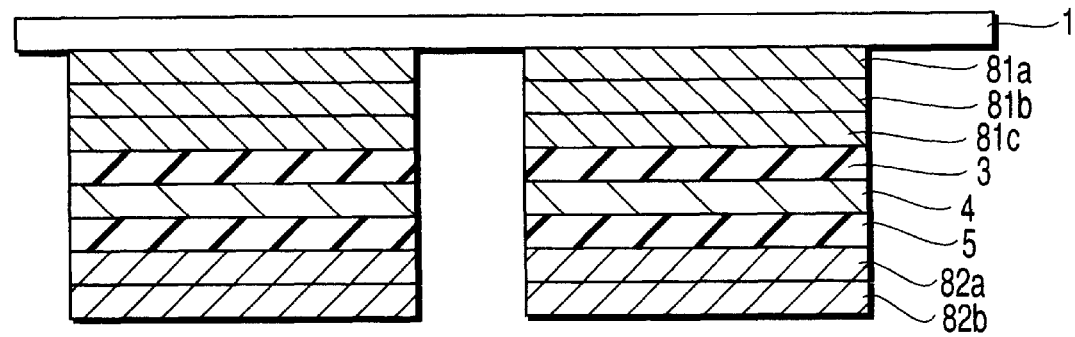
F I G. 8D

PHOTOMASK

CROSS-REFERENCE TO RELATED APPLICATIONS

This application is based upon and claims the benefit of priority from the prior Japanese Patent Application No. 11-274722, filed Sep. 28, 1999, the entire contents of which are incorporated herein by reference.

BACKGROUND OF THE INVENTION

The present invention relates to a photomask having a anti-reflection structure.

Pattern transfer is carried out in the following manner in the process that forms a resist pattern by applying a resist on a film to be processed (hereinafter called "to-be-processed film") on a substrate and performing exposure and development using an exposure apparatus, such as a stepper. The light that has emitted from a light source and condensed by a lens is focused again on the resist by the lens, thereby forming the latent image of the same pattern as the mask (the latent image of a reduced pattern in the case of reduction projection) on the resist. As a result, a mask pattern is transferred on the resist. The mask that is used in this pattern transfer normally has a thin film of a chromium pattern formed on thick glass.

There is a significant difference between refractive indexes of the glass and chromium or refractive indexes of chromium and air. At the time light actually passes the mask, therefore, reflection at the interface between glass and chromium or the interface between chromium and air becomes very large in this structure.

As a solution to this shortcoming, a three-layer structure of chromium oxide/chromium/chromium oxide has been proposed in place of the single layer of chromium as disclosed in Jpn. Pat. Appln. KOKAI Publication No. 23277/1978. The mask with this three-layer structure is designed on the premise of the use of g rays having an exposure wavelength of 435 nm or i rays of 365 nm. With such an exposure wavelength, the use of the three-layer structure drops the reflectance to 10% or less, which shows a sufficient anti-reflection effect.

Recently, however, the exposure wavelength tends to become shorter as patterns become finer and the exposure light is being shifted to KrF excimer laser light with an exposure wavelength of 248 nm or ArF excimer laser light with an exposure wavelength of 193 nm. The aforementioned refractive indexes also vary in accordance with the shift from the longer wavelength to the shorter one. With this difference in refractive index, therefore, the three-layer structure disclosed in the Japanese publication cannot suppress the reflectance to less than 10% and does not demonstrate a sufficient anti-reflection effect.

Specifically, the reflectance at, for example, the interface between glass and chromium oxide or the interface between chromium and air significantly exceeds 10% in the case of KrF excimer laser light of 248 nm or ArF excimer laser light of 193 nm. Therefore, more than 10% of the incident light is reflected at those two interfaces and repeats complex reflection inside the exposure apparatus.

When such light, which is called stray light, reaches the resist through multiple reflection, the stray light, unlike the normal exposure light, has not undergone normal diffraction and thus works as noise. This noise reduces the resolution of the resist, reducing the exposure latitude and focus depth, and further causes adverse influences, such as a change in the pattern shape according to the numerical aperture of the mask.

One way to solve this problem is to eliminate stray light by lowering the reflectance at the aforementioned interfaces and the structure which has a lamination of a anti-reflection film/glass/chromium/chromium oxide/anti-reflection film is actually proposed in Jpn. Pat. Appln. KOKAI Publication No. 51240/1992. This structure does not however reduce reflection at the interface between glass and chromium and demonstrates an inadequate performance as a anti-reflection structure.

The following show the results of an experiment conducted using a conventional photomask.

FIG. 1 is a cross-sectional view exemplifying the structure of the conventional photomask. This conventional photomask is produced by the following method.

First, a chromium oxide film 3 having a thickness of 30 nm, a chromium film 4 having a thickness of 70 nm and a chromium oxide film 5 having a thickness of 30 nm were laminated in the named order on a quartz substrate 1 having a thickness of 0.9 inch by sputtering. Next, a photosensitive resin with a thickness of 0.5 $\mu$m was applied on the chromium oxide film 5. Then, this photosensitive resin was exposed with an electron beam and developed, yielding a line and space (L/S) pattern of 0.7 $\mu$m/0.7 $\mu$m comprised of the photosensitive resin.

Next, with this pattern of the photosensitive resin used as a mask, the chromium oxide film 3, the chromium film 4 and the chromium oxide film 5 were dry-etched using gas which essentially consists of chlorine. Then, the photosensitive resin was removed, thus completing a photomask as shown in FIG. 1.

This photomask was observed with a laser microscope using a He—Cd laser with a wavelength of 325 nm. It was confirmed that the L/S pattern of the chromium oxide film 3/chromium film 4/chromium oxide film 5 accurately had a dimension of 0.7 $\mu$m/0.7 $\mu$m.

Next, the light reflectance of this mask was measured with KrF excimer laser light of 248 nm. The reflectance at the time of irradiating light from the bottom side of the quartz substrate 1 was 15.3% and the reflectance at the time of irradiating light from the major surface side of the quartz substrate 1 or from the chromium film 4 side was 13.2%, both being very high.

Further, a pattern was actually formed with the photomask prepared in the above-described manner and the performance of the photomask was inspected under the following conditions. A silicon oxide film 22 with a thickness of 200 nm as a to-be-processed film was formed on a silicon substrate 21 by CVD. Then, a solution of DUV 30 (a product by Brewer Science Limited) was provided with spin-coating method on this silicon oxide film 22 and baked for 90 seconds at 225° C., providing a anti-reflection film 23 with a thickness of 60 nm. A resist UV6, produced by Shipley Corporation, was applied on this anti-reflection film 23 and baked for 60 seconds at 130° C., yielding a resist 24 having a thickness of 300 nm.

Then, the photomask was exposed at 27 mJ/cm$^2$ using KrF excimer scanner S202A (NA=0.6 and mask magnification of ×4), manufactured by Nikon Corporation. Thereafter, the to-be-processed substrate was baked for 90 seconds at 130° C. and developed with 2.38% of tetramethylammonium hydroxide (TMAH) for 45 seconds.

FIG. 2 shows an exemplary cross-sectional view of a to-be-processed substrate including the resist pattern that is obtained by the above-described process. While an L/S pattern of 0.175 µm/0.175 µm which was the ¼ pattern of the photomask pattern was formed as designed, the resist had round corners. Then, exposure was conducted while the focus position is varied. The results showed that the focus depth which made the dimension fall within ±10% became very shallow, about 0.4 µm.

As apparent from the results of the experiment, the resolution was deteriorated due to an increased amount of stray light originated from the photomask, and the resist and the exposure apparatus did not demonstrate the intended performances, making the focus depth shallower. In addition, the pattern did not have a rectangular shape.

While the exposure wavelength tends to become shorter as patterns become finer, the above-described conventional method of forming a resist pattern causes the amount of stray light to increase as the reflectance increases in accordance with the shortened exposure wavelength. This results in shortcomings, such as the deterioration of the resolution of the resist.

BRIEF SUMMARY OF THE INVENTION

Accordingly, it is an object of the present invention to provide a photomask which has a low reflectance even when the exposure wavelength becomes shorter.

To achieve the above object, according to a primary aspect of this invention, there is provided a photomask comprising a transparent substrate; a anti-reflection structure having first chromium oxide, chromium and second chromium oxide laminated in order on a major surface of the transparent substrate; and a anti-reflection film formed on a surface of the first chromium oxide and at an interface between the first chromium oxide and the transparent substrate or on at least one of surfaces of the second chromium oxide.

When the anti-reflection film is formed on the surface of the first chromium oxide and at the interface between the first chromium oxide and the transparent substrate, it is desirable that $$1.0 < n < 2.4,\ k < 0.5,\ 0.01\ \mu m < d < 0.3\ \mu m$$

where n is a relative refractive index with respect air representing a complex refractive index at an exposure wavelength of the anti-reflection film, k is an extinction coefficient thereof and d is a thickness of the anti-reflection film.

When the anti-reflection film is formed on a surface of the second chromium oxide, it is desirable that $$1.0 < n < 1.55,\ 0.01 < k < 0.3,\ 0.03\ \mu m < d < 0.3\ \mu m$$

where n is a relative refractive index with respect air representing a complex refractive index at an exposure wavelength of the anti-reflection film, k is an extinction coefficient thereof and d is a thickness of the anti-reflection film.

The anti-reflection film may be a thin film of an organic substance essentially consisting of at least one of carbon, oxygen, nitrogen and hydrogen or a spin-on-glass film.

Because the anti-reflection film is formed on at least one of surfaces of the anti-reflection structure that has chromium oxide, chromium and chromium oxide laminated in order in this invention, it is possible to make the reflectance lower than the one achieved by a photomask which has a anti-reflection structure alone. This ensures an excellent focus depth and provides an excellent pattern shape.

When the anti-reflection film is formed between this anti-reflection structure and the transparent substrate, it is desirable that $$1.0 < n < 2.4,\ k < 0.5,\ 0.01\ \mu m < d < 0.3\ \mu m$$

where n is a relative refractive index with respect air representing a complex refractive index at an exposure wavelength of the anti-reflection film, k is an extinction coefficient thereof and d is a thickness of the anti-reflection film.

When the anti-reflection film is formed on the opposite surface of the anti-reflection structure to the transparent substrate, it is desirable that $$1.0 < n < 1.55,\ 0.01 < k < 0.3,\ 0.03\ \mu m < d < 0.3\ \mu m$$

where n is a relative refractive index with respect air representing a complex refractive index at an exposure wavelength of the anti-reflection film, k is an extinction coefficient thereof and d is a thickness of the anti-reflection film.

The reason for selecting those conditions is based on the following results of an experiment shown in FIG. 11. In FIG. 11, the horizontal scale represents the value of the extinction coefficient k of the anti-reflection film and the vertical scale represents the reflectance. The experiment was conducted under the conditions that the anti-reflection film is formed on the opposite surface of the anti-reflection structure to the transparent substrate and the thicknesses of the individual elements of the anti-reflection structure of chromium oxide/chromium/chromium oxide are respectively 30 nm, 70 nm and 30 nm.

The wavelength of light incident to the photomask is 248 nm, the value of the relative refractive index n of the anti-reflection film is 1.4 and the thickness d=0.22 µm. As apparent from FIG. 11, with k being equal to or less than 0.3, the reflectance becomes equal to or less than 4%, demonstration of a sufficient anti-reflection effect. Likewise, when the value of n or d is shifted, the aforementioned desirable conditions are derived.

According to another aspect of this invention, there is provided a photomask comprising a transparent substrate; a anti-reflection structure having chromium and chromium oxide laminated in order on a major surface of the transparent substrate; a pellicle disposed apart from a surface of the anti-reflection structure by a predetermined distance and formed of a transparent member; and a anti-reflection film formed on a surface of the pellicle.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are step-by-step cross-sectional views showing a method of producing a photomask according to a second embodiment of this invention;

FIGS. 8A through 8D are cross-sectional views depicting a modification of the photomask according to this invention;

DETAILED DESCRIPTION OF THE INVENTION

Preferred embodiments of the present invention will now be described with reference to the accompanying drawings.

First Embodiment

Figure 3A:
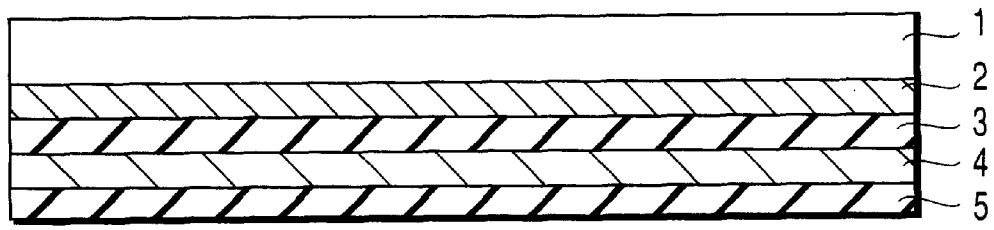
FIGS. 3A through 3C are step-by-step cross-sectional views showing a method of producing a photomask according to a first embodiment of the present invention.
Figure 3B:
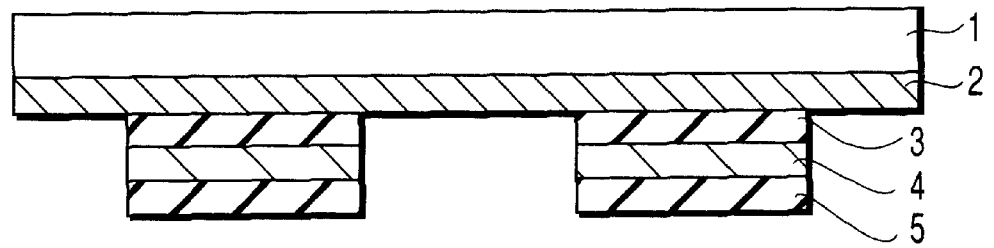
Figure 3C:
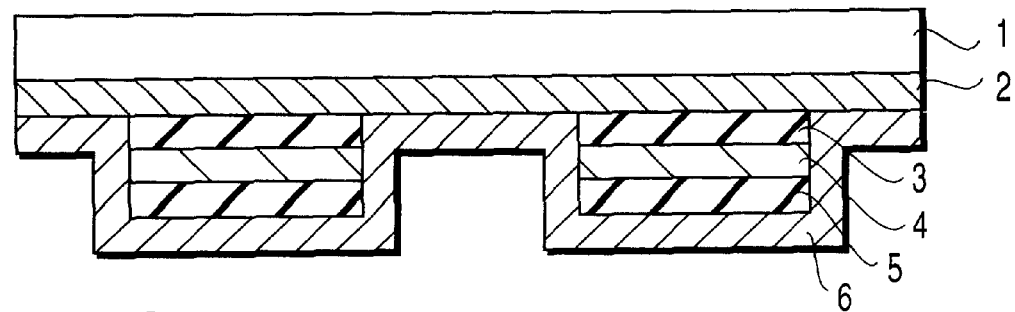

FIGS. 3A through 3C are step-by-step cross-sectional views showing a method of producing a photomask according to the first embodiment of this invention.

First, an LiF film 2 is formed as a anti-reflection film on the major surface of a quartz substrate 1 with a thickness of 0.9 inch by vacuum deposition. In the present embodiment, the quartz substrate 1 serves as a transparent substrate. Then, $1 \times 10^{19}$ cm$^{-3}$ of silicon is doped into this LiF film 2 using ion implantation. This LiF film 2 serves as a anti-reflection film. It is desirable that the LiF film 2 in use should satisfy $$1.0 < n < 2.4, \ k < 0.5, \ 0.01 \ \mu m < d < 0.3 \ \mu m$$

where n is a relative refractive index with respect air representing a complex refractive index at the exposure wavelength of the anti-reflection film, k is an extinction coefficient thereof and d is the thickness of the anti-reflection film.

In this embodiment, this LiF film 2 has a thickness of 0.08 $\mu m$ and n=1.45 and k=0.05, which meet the aforementioned conditions. The complex refractive index, n*, is expressed by n*=n−ik where n is a relative refractive index to air and k is an extinction coefficient.

Next, a chromium oxide film 3 having a thickness of 30 nm, a chromium film 4 having a thickness of 70 nm and a chromium oxide film 5 having a thickness of 30 nm are laminated in the named order on the LiF film 2 by sputtering (FIG. 3A).

Next, a photosensitive resin with a thickness of 0.5 $\mu m$ is applied on the chromium oxide film 5. Then, this photosensitive resin is exposed with an electron beam and developed, yielding a line and space (L/S) pattern of 0.7 $\mu m$/0.7 $\mu m$ comprised of the photosensitive resin.

With this L/S pattern used as a mask, the lamination structure of the chromium oxide 3/chromium 4/chromium oxide 5 is patterned by dry etching. This patterning uses gas which essentially consists of, for example, chlorine. After this patterning, the photosensitive resin is removed (FIG. 3B).

Then, a solution of spin-on-glass is applied so as to cover the surfaces of the LiF film 2 and chromium oxide film 5. Next, baking is conducted for 5 seconds at 200° C., thus forming a spin-on-glass film 6 as a anti-reflection film on the entire major surface of the transparent substrate 1. It is desirable that the spin-on-glass film 6 is use should satisfy $$1.0 < n < 1.55, \ 0.01 < k < 0.3, \ 0.03 \ \mu m < d < 0.3 \ \mu m$$

where n is a relative refractive index with respect air representing a complex refractive index at the exposure wavelength of the spin-on-glass film 6, k is an extinction coefficient thereof and d is the thickness of the anti-reflection film.

In this embodiment, this spin-on-glass film 6 has a thickness of 0.04 $\mu m$ and n=1.54 and k=0.05, which meet the aforementioned conditions. The formation of the spin-on-glass film 6 completes the photomask (FIG. 3C).

The photomask prepared through the above-described steps was observed with a laser microscope using a He—Cd laser (wavelength of 325 nm). The observation showed that the laminated L/S pattern of the chromium oxide film 3/chromium film 4/chromium oxide film 5 accurately had a dimension of 0.7 $\mu m$/0.7 $\mu m$.

Figure 1:
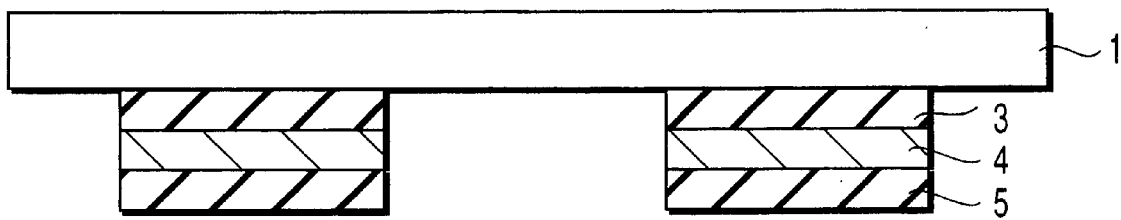
FIG. 1 is a cross-sectional view exemplifying the structure of the conventional photomask.
Figure 2:
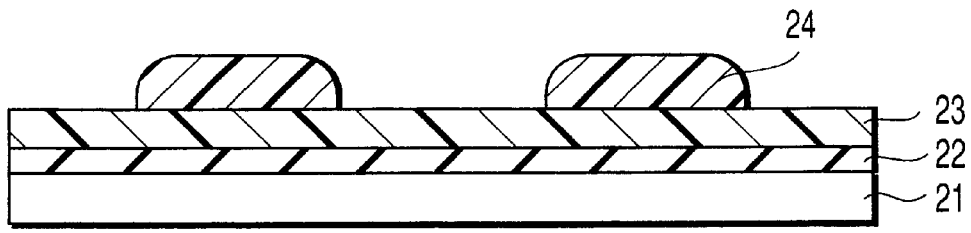
FIG. 2 is an exemplary cross-sectional view of a resist pattern which is formed by using the conventional photomask.

Next, the light reflectance of this mask was measured with KrF excimer laser light of 248 nm. This measurement showed that reflectance with KrF excimer laser light irradiated from the bottom side of the quartz substrate 1 was 1.5% and the reflectance with KrF excimer laser light irradiated from the major surface side of the quartz substrate 1 or from the spin-on-glass film 6 side was 3.8%. The results of experiments using the conventional scheme illustrated in FIGS. 1 and 2 showed the corresponding reflectances of 15.3% and 13.2%. The comparison of the experimental results of this invention with those of the conventional scheme showed that this invention sufficiently provided reduction of reflection as compared with the conventional scheme.

Figure 4:
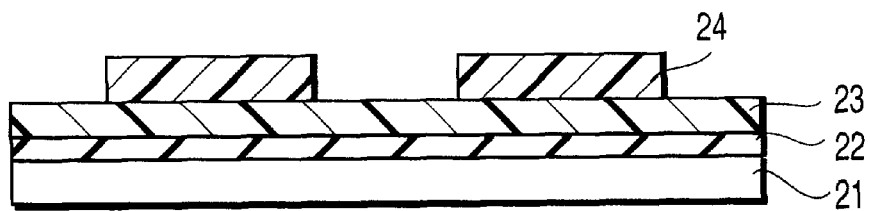
FIG. 4 is an exemplary cross-sectional view of a to-be-processed substrate on which a pattern is formed by using the photomask according to this embodiment.

Further, a pattern was actually formed with the photomask prepared in the above-described manner and the performance of the photomask was checked under the following conditions. FIG. 4 is an exemplary cross-sectional view of a to-be-processed substrate on which a pattern is formed by using the photomask according to this embodiment.

A silicon oxide film 22 with a thickness of 200 nm as a to-be-processed film was formed on a silicon substrate 21 by CVD. Then, a solution of DUV 30 (a product by Brewer Science Limited) was provided with spin-coating method on this silicon oxide film 22. The resultant structure was then baked for 90 seconds at 225° C., providing a thin anti-reflection film 23 of 60 nm. Further, a resist UV6, produced by Shipley Corporation, was applied on this anti-reflection film 23 and baked for 60 seconds at 130° C., yielding a resist 24 having a thickness of 300 nm.

The photomask was exposed at 27 mJ/cm$^2$ using KrF excimer scanner S202A (NA=0.6 and mask magnification of ×4), manufactured by Nikon Corporation. After exposure, the to-be-processed substrate was baked for 90 seconds at 130° C. and developed with 2.38% of tetramethylammonium hydroxide (TMAH) for 45 seconds. As shown in FIG. 4, an L/S pattern of 0.175 $\mu m$/0.175 $\mu m$ which was the ¼ pattern of the photomask pattern was formed as designed and the cross-sectional structure of the resist had a rectangular shape. Then, exposure was conducted while the focus position is varied. The results showed an excellent focus depth of about 1.2 µm which made the dimension fall within ±10%.

By contrast, the conventional scheme illustrated in FIGS. 1 and 2 provided a focus depth of about 0.4 µm. It is apparent that the focus depth provided by this embodiment is deeper than the conventional focus depth.

In short, this embodiment can reduce the amount of stray light by lowering the reflectance to or less than 4%, much smaller than the one achieved by the conventional photomask shown in FIG. 1. Therefore, the resist and the exposure apparatus can demonstrate the intended performances, ensuring an excellent focus depth and excellent pattern shape.

Second Embodiment

FIGS. 5A and 5B are cross-sectional views showing the general structure of a photomask according to the second embodiment of this invention. This embodiment relates to a modification of the first embodiment and differs from the first embodiment in the type of the anti-reflection film and the scheme of patterning the anti-reflection film.

First, an $MgF_2$ film 32 with a thickness of 0.09 µm is formed as a anti-reflection film on the major surface of a quartz substrate 1 with a thickness of 0.9 inch by vacuum deposition. Then, $3\times10^{19}$ cm$^{-3}$ of phosphorus is doped into this $MgF_2$ film 32 using ion implantation. This $MgF_2$ film 32 serves as a anti-reflection film.

It is desirable that the $MgF_2$ film 32 in use should satisfy $$1.0<n<2.4, k<0.5, 0.01 \, \mu m<d<0.3 \, \mu m$$

where n is a relative refractive index with respect air representing a complex refractive index at the exposure wavelength of the anti-reflection film, k is an extinction coefficient thereof and d is the thickness of the anti-reflection film. In this embodiment, this $MgF_2$ film 32 has a thickness of 0.09 µm and n=1.58 and k=0.12, which meet the aforementioned conditions.

Next, the chromium oxide film 3 having a thickness of 30 nm, the chromium film 4 having a thickness of 70 nm and the chromium oxide film 5 having a thickness of 30 nm are laminated in the named order on the $MgF_2$ film 32 by sputtering. Further, a solution of DUV 30 (a product by Brewer Science Limited) was provided with spin-coating method on this silicon oxide film 22 and then baked for 90 seconds at 225° C., yielding a DUV30 film 36 (FIG. 5A). This DUV30 film 36 serves as a anti-reflection film.

It is desirable that the DUV30 film 36 in use should satisfy $$1.0<n<1.55, 0.01<k<0.3, 0.03 \, \mu m<d<0.3 \, \mu m$$

where n is a relative refractive index with respect air representing a complex refractive index at the exposure wavelength of the DUV30 film 36, k is an extinction coefficient thereof and d is the thickness of the DUV30 film 36. In this embodiment, this DUV30 film 36 has a thickness of 100 nm and n=1.45 and k=0.25, which meet the aforementioned conditions.

Next, a photosensitive resin with a thickness of 0.5 µm is applied on the DUV30 film 36. Then, this photosensitive resin is exposed with an electron beam and developed, yielding an L/S pattern of 0.6 µm/0.6 µm comprised of the photosensitive resin. Then, with this pattern of the photosensitive resin used as a mask, the lamination structure of the chromium oxide 3/chromium 4/chromium oxide 5/DUV30 film 36 is patterned by dry-etching using gas which essentially consists of chlorine. Then, the photosensitive resin is removed, thus completing a photomask (FIG. 5B).

The photomask prepared through the above-described steps was observed with a laser microscope using a He—Cd laser (wavelength of 325 nm). The observation showed that the lamination pattern of the chromium oxide film 3/chromium film 4/chromium oxide film 5/DUV30 film 36 accurately had a dimension of 0.6 µm/0.6 µm.

Next, the light reflectance of this mask was measured with ArF excimer laser light of 193 nm. This measurement showed that reflectance with ArF excimer laser light irradiated from the bottom side of the quartz substrate 1 was 1.9% and the reflectance with ArF excimer laser light irradiated from the major surface side of the quartz substrate 1 or from the DUV30 film 36 side was 3.5%. The results of the experiments showed that this invention sufficiently reduced reflection as compared with the conventional scheme.

Further, a pattern was actually formed with the photomask prepared in the above-described manner and the performance of the photomask was checked under the following conditions. A silicon oxide film 22 with a thickness of 200 nm as a to-be-processed film was formed on a silicon substrate 21 by CVD. Then, a solution of DUV 30 (a product by Brewer Science Limited) was provided with spin-coating method on this silicon oxide film 22, and then baked for 90 seconds at 225° C. This yielded the thin anti-reflection film 23 of 55 nm. Further, a resist ZEP-001, produced by Nippon Zeon Co., Ltd., was applied 300 nm thick on this anti-reflection film 23 and baked.

The photomask was exposed and baked using the above-described photomask and ArF excimer scanner S202A of Nikon Corporation (NA=0.6 and mask magnification of ×4), and developed with tetramethylammonium hydroxide (TMAH). The acquired resist pattern had an L/S pattern of 0.175 µm/0.175 µm, the ¼ pattern of the photomask pattern, formed as designed. The cross-sectional constructure of the resist, like the one in FIG. 4, had a rectangular shape. Then, exposure was carried out while the focus position is varied. The results showed an excellent focus depth of about 1.0 µm which made the dimension fall within ±10% and was deeper than the one achieved by the conventional scheme.

To clarify the advantages of this embodiment, the results of an experiment using the conventional photomask will be described as a comparative example. The cross-sectional view showing the structure of the conventional photomask which will be discussed as the comparative example for this embodiment is the same as shown in FIG. 1. So is the method of manufacturing the comparative example. To make the comparison of the experimental conditions in this embodiment easier, the lamination structure of the chromium oxide 3/chromium 4/chromium oxide 5 was made to have an L/S pattern of 0.6 µm/0.6 µm.

This conventional photomask was observed with a laser microscope using a He—Cd laser (wavelength of 325 nm). The observation showed that the laminated L/S pattern of the chromium oxide film 3/chromium film 4/chromium oxide film 5 accurately had a dimension of 0.6 µm/0.6 µm.

Next, the light reflectance of this mask was measured with ArF excimer laser light of 193 nm. This measurement showed that reflectance with ArF excimer laser light irradiated from the bottom side of the quartz substrate 1 was 18.2% and the reflectance with ArF excimer laser light irradiated from the major surface side of the quartz substrate 1 or from the chromium film 4 side was 15.4%, significantly higher than those of this embodiment.

Further, a pattern was actually formed with the photomask prepared in the above-described manner and the performance of the photomask was inspected. The experimental conditions are the same as the conditions of the first embodiment, except for the use of the photomask that has an L/S pattern of 0.6 µm/0.6 µm.

While an L/S pattern of 0.15 µm/0.15 µm which was the ¼ pattern of the photomask pattern was formed as designed, the resist had round corners. Then, exposure was conducted while the focus position is varied. The results showed that the focus depth which made the dimension fall within ±10% was about 0.3 µm, shallower than the one achieved by the first embodiment.

As apparent from the above, the second embodiment has effects similar to those of the first embodiment even if a different type of anti-reflection film from the one used in the first embodiment is used, the photomask is formed under different conditions from those of the first embodiment and the DUV30 film 36 is patterned in the same way as the chromium oxide 3/chromium 4/chromium oxide 5.

Third Embodiment

Figure 6A:
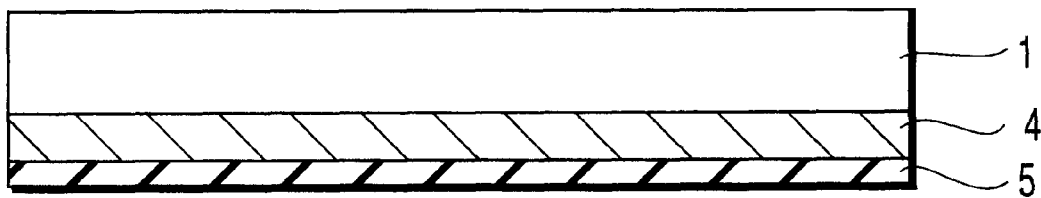
FIGS. 6A through 6C are step-by-step cross-sectional views showing a method of producing a photomask according to a third embodiment of this invention.
Figure 6B:
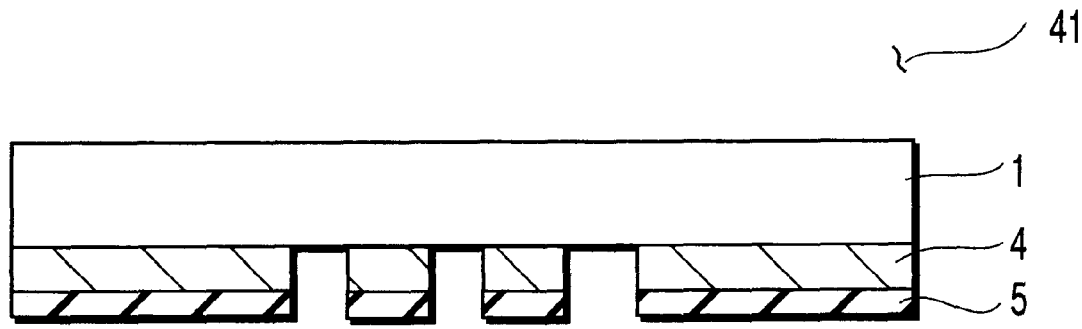
Figure 6C:
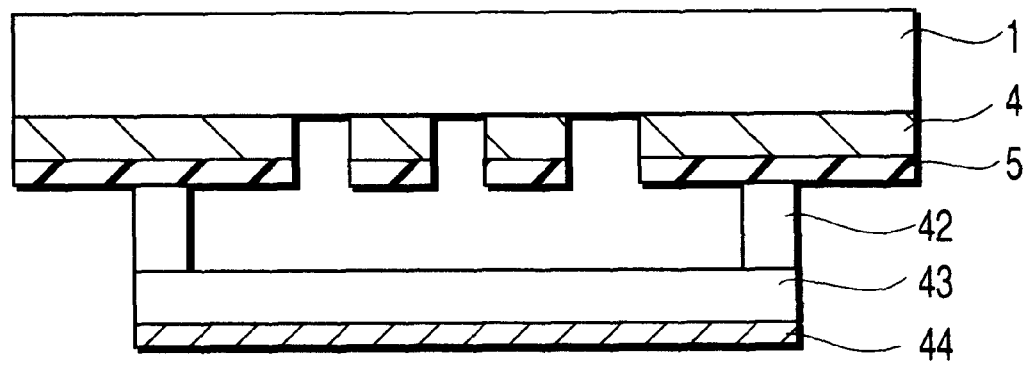

FIGS. 6A through 6C are cross-sectional views showing the general structure of a photomask according to the second embodiment of this invention. This embodiment relates to a modification of the first and second embodiments, in which a anti-reflection film is formed on a pellicle.

First, the chromium film 4 having a thickness of 30 nm and the chromium oxide film 5 having a thickness of 70 nm are laminated in the named order on the major surface of the quartz substrate 1 having a thickness 0.9 inch by sputtering (FIG. 6A). Next, a photosensitive resin with a thickness of 0.5 µm is applied on the chromium oxide film 5. Then, this photosensitive resin is exposed with an electron beam and developed, yielding an L/S pattern of 0.7 µm/0.7 µm comprised of the photosensitive resin. Then, with this pattern of the photosensitive resin used as a mask, the lamination structure of the chromium 4/chromium oxide 5 is dry-etched using gas which essentially consists of chlorine. Thereafter, the photosensitive resin is removed, thus completing a reticle body 41 (FIG. 6B).

To prevent a defect such as dust from being stuck onto the reticle body 41, a pellicle 43 is adhered to the reticle body 41 using a frame 42 in such a way as to cover a semiconductor circuit pattern comprised of the aforementioned, patterned chromium film 4/chromium oxide film 5.

The frame 42 is a member which is secured supported on the reticle body 41 and has a predetermined height in the direction perpendicular to the surface of the reticle body 41. The frame 42 supports the pellicle 43. The frame 42 is made of aluminum alloy processed with black anodized aluminum. The interior of the frame 42 is entirely covered with low-molecular Teflon and the pellicle 43 and the frame 42 are adhered by an acrylic adhesive.

In the case where the exposure wavelength is the wavelength of DUV (Deep-UV) light, such as KrF light or ArF light, the pellicle 43 is formed of low-molecular Teflon (polytetrafluoroethylene) and has a transmittance of 98% or higher and a thickness of 820±30 nm. This pellicle 43 is placed apart from the optical image forming position of the illumination optical system of the exposure apparatus. The pellicle 43 is formed with such a strength that it is not torn even by air blow of, for example, 1.4 kg/cm².

A anti-reflection film 44 is formed on the major surface of the pellicle 43 but opposite to the reticle body 41. Used as this anti-reflection film 44 is a thin film of DUV30 (a product by Brewer Science Limited) having a thickness of 100 nm which is formed by spin-coating a solution of DUV 30 and baking the film for 90 seconds at 225° C. The values n and k that define the complex refractive index of the anti-reflection film 44 is 1.60 and 0.35, respectively.

It is desirable that the anti-reflection film formed on this pellicle 43 should satisfy $$1.0<n<2.4,\ k<0.5,\ 0.01\ \mu m<d<0.3\ \mu m$$

where n is a relative refractive index with respect air representing a complex refractive index at the exposure wavelength of the anti-reflection film, k is an extinction coefficient thereof and d is the thickness of the anti-reflection film. A photomask is completed through the above-described steps (FIG. 6C).

The photomask prepared through the above-described steps was observed with a laser microscope using a He—Cd laser (wavelength of 325 nm). The observation showed that the laminated L/S pattern of the chromium film 4/chromium oxide film 5 accurately had a dimension of 0.7 µm/0.7 µm.

Next, the light reflectance of this mask was measured with KrF excimer laser light of 248 nm. The results showed that the reflectance of light which travels toward the reticle body 41 from the frame 42 side was 3.2%, indicating that reflection was sufficiently suppressed.

Further, a pattern was actually formed with the photomask prepared in the above-described manner and the performance of the photomask was checked under the following conditions. A silicon oxide film 22 with a thickness of 200 nm as a to-be-processed film was formed on a silicon substrate 21 by CVD. Then, a solution of DUV30 (a product by Brewer Science Limited) was provided with spin-coating method on this silicon oxide film 22, and then baked for 90 seconds at 225° C. This yielded the thin anti-reflection film 23 of 60 nm. Further, a resist UV6, produced by Shipley Corporation, was applied on this anti-reflection film 23 and baked for 60 seconds at 130° C. This yielded the resist 24 with a thickness of 300 nm.

Then, the photomask was exposed at 27 mJ/cm² using KrF excimer scanner S202A (NA=0.6 and mask magnification of ×4), manufactured by Nikon Corporation. Thereafter, the resultant structure was baked for 90 seconds at 130° C. and developed with tetramethylammonium hydroxide (TMAH) for 45 seconds.

The acquired resist pattern, like the resist pattern of the first embodiment shown in FIG. 4, had an L/S pattern of 0.175 µm/0.175 µm, the ¼ pattern of the photomask pattern, formed as designed. The cross-sectional structure of the resist had a rectangular shape. Then, exposure was carried out while the focus position is varied. The results showed an excellent focus depth of about 1.2 µm which made the dimension fall within ±10%.

There are experimental results showing that with the use of the conventional pellicle, 98% or more of stray light transmits the mask in the opposite direction and repeats complicated reflection inside the exposure apparatus. By contrast, this embodiment suppresses the transmission of stray light in the opposite direction to or less than 4%. It is therefore possible to prevent adverse influences, such as making the exposure latitude and focus depth smaller and the pattern shape being changed according to the numerical aperture of the mask. This can allow the resist and the exposure apparatus to demonstrate the intended performances.

Figure 7A:
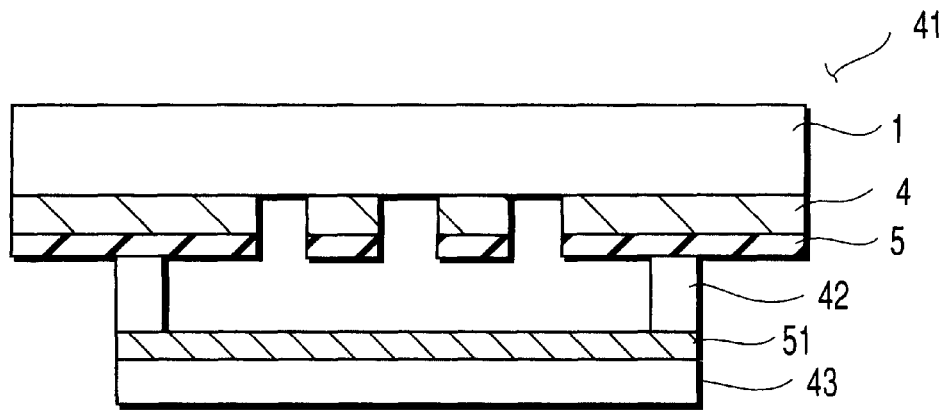
FIGS. 7A through 7C are cross-sectional views depicting a modification of the photomask according to the third embodiment.
Figure 7B:
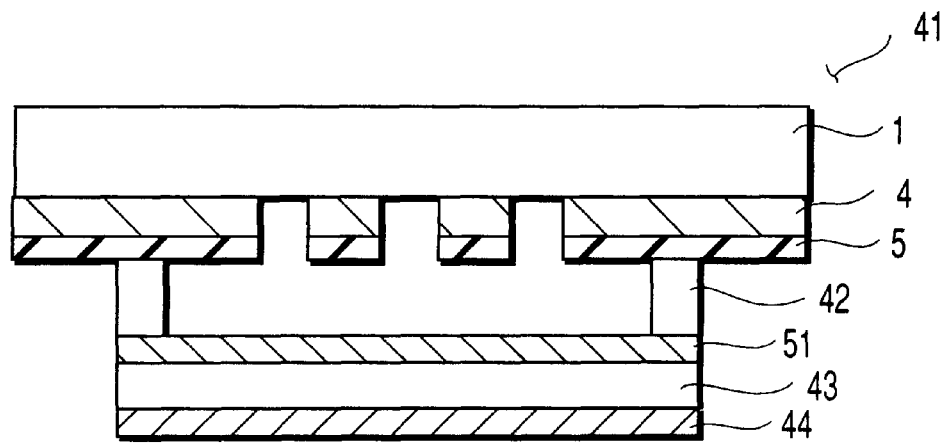
Figure 7C:
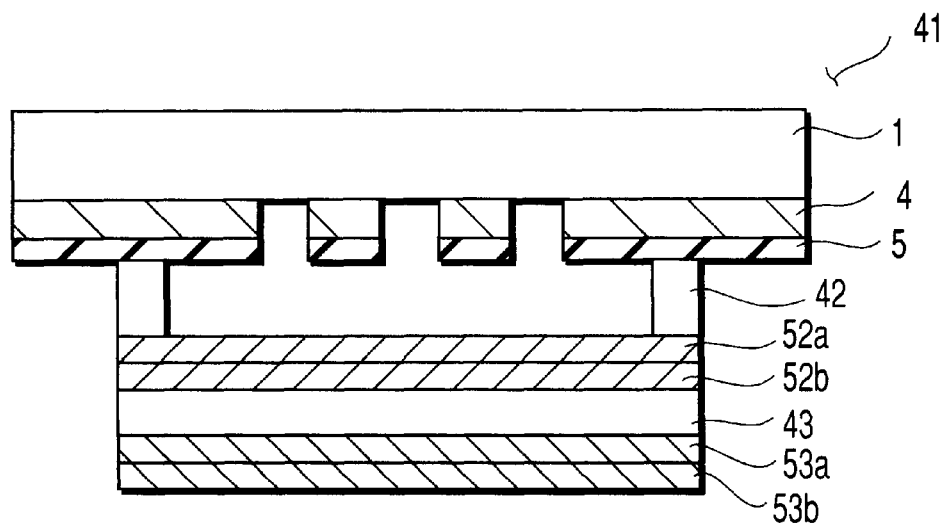

Although the foregoing description of this embodiment has been given of the case where the anti-reflection film 44 is formed on the opposite surface of the pellicle 43 to the reticle body 41, this embodiment is not limited to this particular mode. FIGS. 7A through 7C are cross-sectional views depicting a modification of the photomask according to the third embodiment.

As shown in FIG. 7A, a anti-reflection film 51 may be adhered to that side of the pellicle 43 which faces the reticle body 41. As shown in FIG. 7B, anti-reflection films 51 and 44 may be adhered to both sides of the pellicle 43. Further, the anti-reflection films adhered to both sides of the pellicle 43 may respectively have a lamination structure of films 52a and 52b and a lamination structure of films 53a and 53b. Needless to say, the number of the laminated layers of the anti-reflection film is not limited to two but any number of layers may be laminated. In the modification shown in FIGS. 7A–7C, the desirable ranges for the thickness of the anti-reflection film to be adhered to the pellicle 43 and the values n and k that define the refractive index are the same as those of the anti-reflection film 44 in the above-described embodiment.

This invention is not restricted to the above-described embodiments. FIGS. 8A through 8D are cross-sectional views of a photomask which relates to a modification of this invention. Like or same reference numerals are given to those components which are the same as the corresponding components of the first to third embodiments. Reference numeral "81" denotes a anti-reflection film which is formed between the transparent substrate 1 and the chromium oxide film 3, and reference numeral "82" denotes a anti-reflection film which is formed on the opposite surface of the chromium oxide film 5 to the transparent substrate 1.

FIGS. 8A–8C show examples where any of the chromium oxide film 3/chromium film 4/chromium oxide film 5 and the anti-reflection film 81 or 82 is patterned on the transparent substrate 1. FIG. 8A shows the case where only the anti-reflection film 81 is formed, FIG. 8B shows the case where only the anti-reflection film 82 is formed, and FIG. 8C shows the case where the anti-reflection films 81 and 82 are both formed. FIG. 8D shows the case where the anti-reflection film 81 has a lamination structure of films 81a and 81c and the anti-reflection film 82 has a lamination structure of films 82a and 82b.

Figure 9A:
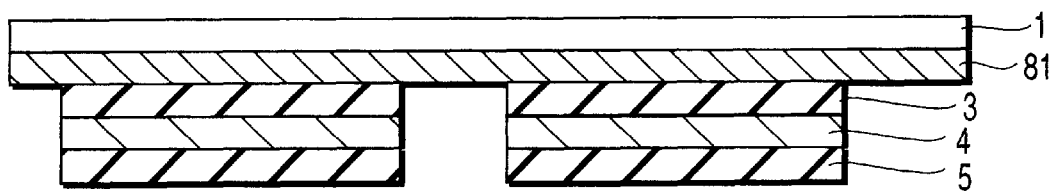
FIGS. 9A through 9C are cross-sectional views depicting another modification of the photomask according to this invention.
Figure 9B:
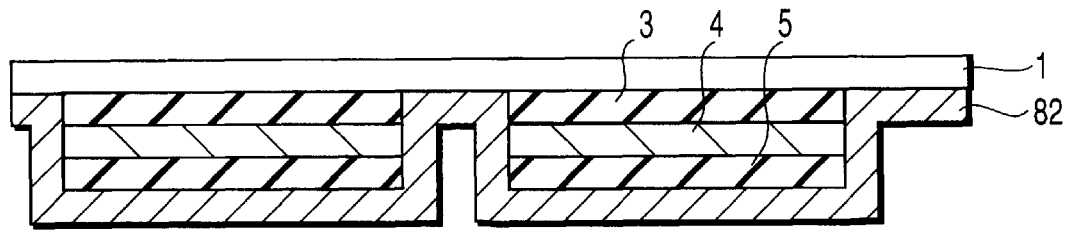
Figure 9C:
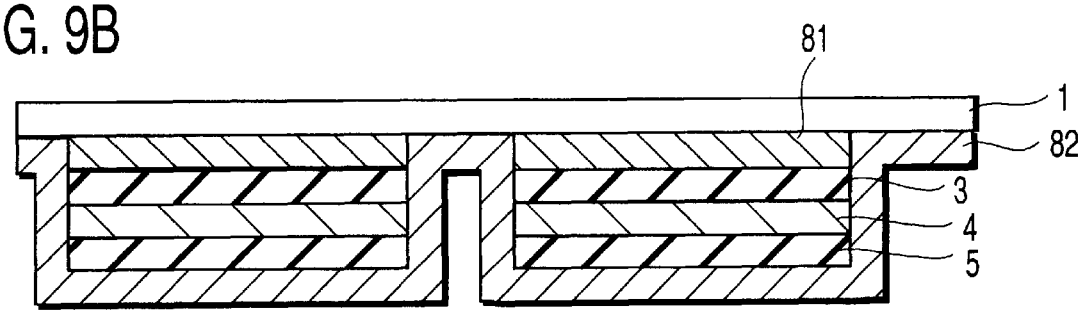
Figure 11:
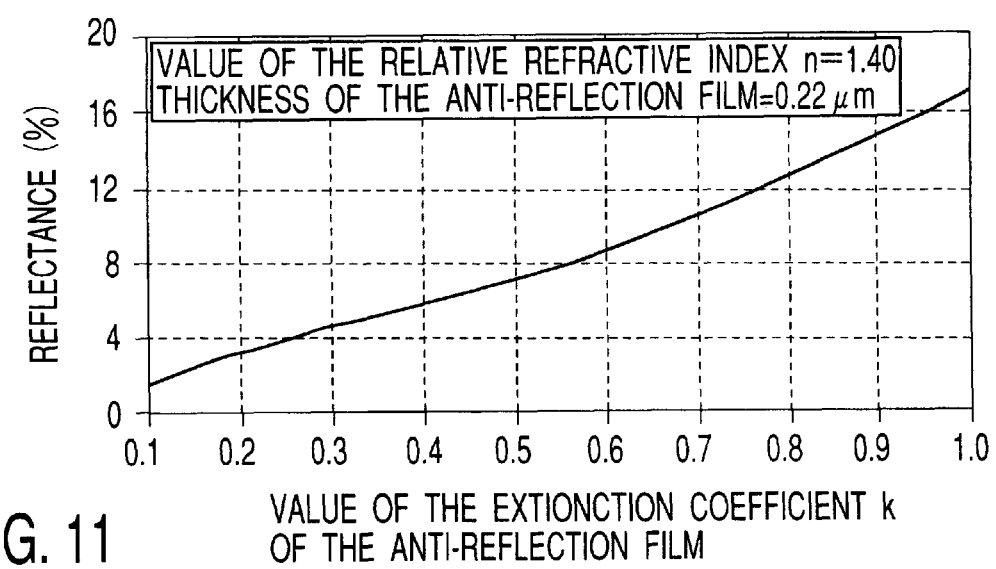
FIG. 11 is a diagram for explaining desirable parameters for the photomask according to this invention.

FIG. 9A shows the case where the anti-reflection film 81 is not patterned, FIGS. 9B and 9C show the cases where the anti-reflection film 82 is formed on the entire surface of the transparent substrate 1 including the surface of the chromium oxide film 5 without being patterned. FIG. 9B shows the case where the anti-reflection film 81 is not patterned, and FIG. 9C shows the case where the anti-reflection film 81 is formed by patterning.

Figure 10A:
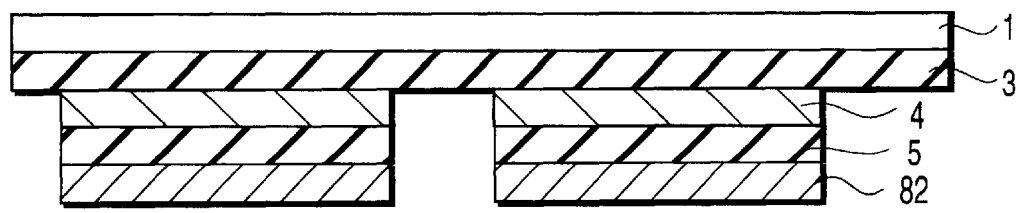
FIGS. 10A through 10E are cross-sectional views depicting a further modification of the photomask according to this invention.
Figure 10B:
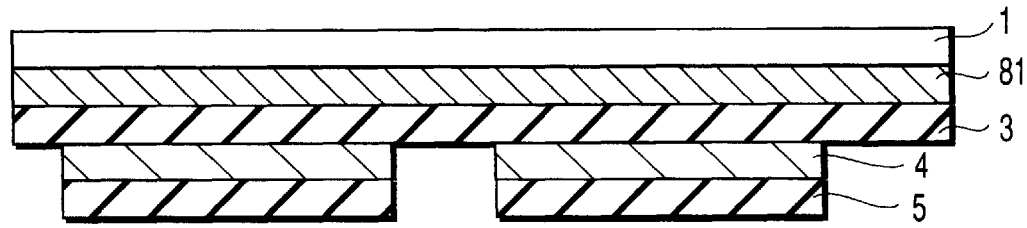
Figure 10C:
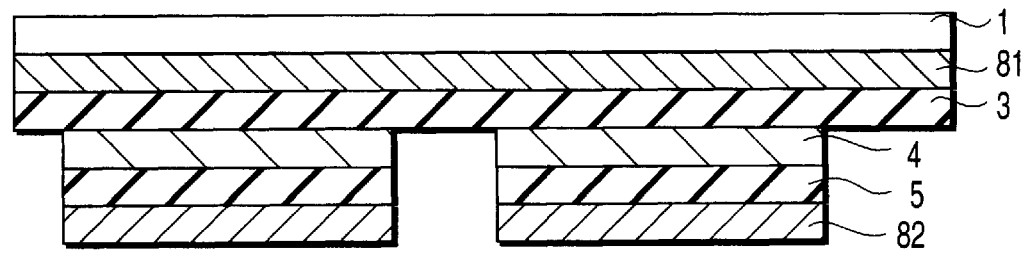
Figure 10D:
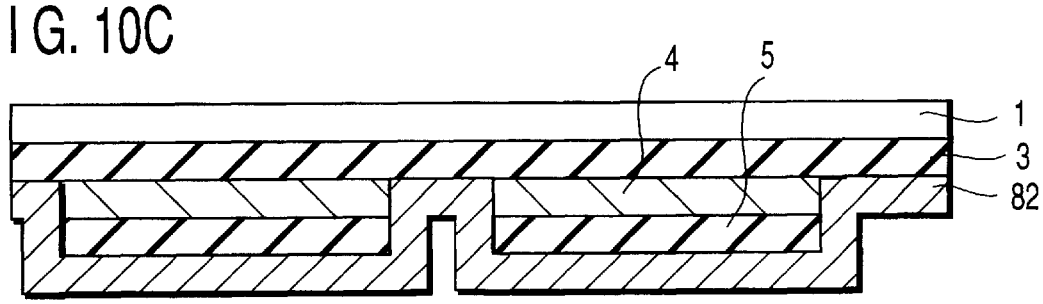
Figure 10E:
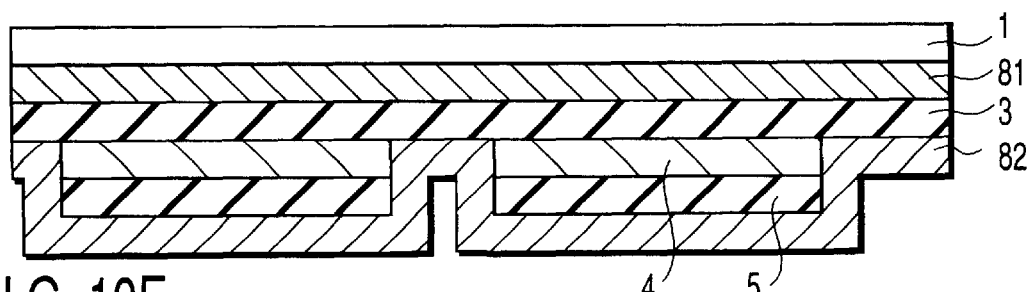

FIGS. 10A through 10E show the cases where the chromium oxide film 3 is not patterned. FIG. 10A shows the case where only the anti-reflection film 81 is formed by patterning, FIG. 10B shows the case where only the anti-reflection film 81 is formed, FIG. 10C shows the case where the anti-reflection film 82 is also formed by patterning, FIG. 10D shows the case where only the anti-reflection film 82 is formed without being patterned, and FIG. 10E shows the case where neither the anti-reflection film 81 nor the anti-reflection film 82 is patterned.

As apparent from the above-described modifications, the chromium oxide film 3 and anti-reflection films 81 and 82 demonstrate the effect of this invention, regardless of whether they are patterned or not and various combinations can be selected in accordance with the degree of the simpleness of the process and the intended performance of the photomask. Note that the anti-reflection film may have a lamination structure in which case the number of laminated layers is not limited.

Although LiF or $MgF_2$ is used for the anti-reflection film in the above-described embodiments, the material is not restricted to those two.

For example, NaF, $BaF_2$, $CaF_2$, $SrF_2$, $PbF_2$, $Al_2F_3$, $LaF_3$, $YF_3$, ZnO, ZnS, ZrO, $Al_2O_3$, $SiO_2$, $SnO_2$, $TaO_5$, SiN and indium tin oxide (ITO) may be used singularly or a selective mixture of them may be used.

The anti-reflection film may essentially consist of a thin dielectric film doped with be some element. For example, the essential constituent may have a metal element, such as Au, Ag, Al, Pt, Sr, B, Ga or In, or an element, such as C, Si, Ge, Pb, P, As, Sb, Bi or H, may be doped into a single one of the substances listed above or a selective mixture thereof by ion implantation or the like.

Further, the anti-reflection film may be a thin film of an organic substance essentially consisting of carbon, oxygen, nitrogen or hydrogen or may be a spin-on-glass film.

Further, the material for the chromium oxide films that sandwich the chromium film may be replaced with another material. For instance, the material may be chromium nitride, chromium oxide nitride, chromium fluoride, molybdenum oxide silicide, molybdenum nitride silicide or molybdenum oxide nitride silicide. Further, the upper and lower films which sandwich the chromium film and whose materials are changed this way should not necessarily be formed of the same material.

According to this invention, as described in detail above, because a anti-reflection film is formed on the surface of at least one of chromium oxides in the anti-reflection structure that is formed by the lamination of chromium oxide, chromium and chromium oxide in order, it is possible to make the reflectance lower than can be achieved by the photomask that has the anti-reflection structure alone. This invention can therefore ensure an excellent focus depth and an excellent pattern shape.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask comprising:

a transparent substrate;

an anti-reflection structure having a first chromium oxide, chromium, and a second chromium oxide laminated in order on a major surface of said transparent substrate; and a first anti-reflection film formed on a surface of said first chromium oxide and at an interface between said first chromium oxide and said transparent substrate, wherein said first anti-reflection film has the following properties:

$1.0 < n < 2.4$, $k < 0.5$, and $0.01 \ \mu m < d < 0.3 \ \mu m$, where n is a relative refractive index with respect to air representing a complex refractive index at an exposure wavelength of said first anti-reflection film, k is an extinction coefficient thereof, and d is a thickness of said first anti-reflection film.

2. The photomask according to claim 1, further comprising a second anti-reflection film formed on a surface of the second chromium oxide, wherein said second anti-reflection film has the following properties:

$1.0 < n < 2.4$, $k < 0.5$, and $0.01 \ \mu m < d < 0.3 \ \mu m$, where n is a relative refractive index with respect to air representing a complex refractive index at an exposure wavelength of said second anti-reflection film, k is an extinction coefficient thereof, and d is a thickness of said second anti-reflection film.

3. The photomask according to claim 1, wherein said first anti-reflection film is formed all over the transparent substrate, and a second anti-reflection film is formed on the second chromium oxide and first anti-reflection film with substantially the same thickness.

4. The photomask according to claim 1, wherein said first anti-reflection film is a thin film of an organic substance, a main component of which includes at least one of carbon, oxygen, nitrogen and hydrogen.

5. The photomask according to claim 1, wherein said first anti-reflection film is a spin-on-glass film.

6. A photomask comprising:

a transparent substrate;

an anti-reflection structure having a first chromium oxide, chromium, and a second chromium oxide laminated in order on a major surface of said transparent substrate; and a first anti-reflection film formed on said second chromium oxide, wherein said first anti-reflection film has the following properties:

1.0<n<2.4, k<0.5, and 0.01 $\mu$m<d<0.3 $\mu$m, where n is a relative refractive index with respect to air representing a complex refractive index at an exposure wavelength of said first anti-reflection film, k is an extinction coefficient thereof, and d is a thickness of said first anti-reflection film.

7. The photomask according to claim 6, further comprising:

a second anti-reflection film formed on a major surface of the transparent substrate and on the transparent substrate, wherein said second anti-reflection film has the following properties:

1.0<n<2.4, k<0.5, and 0.01 $\mu$m<d<0.3 $\mu$m, where n is a relative refractive index with respect to air representing a complex refractive index at an exposure wavelength of said second anti-reflection film, k is an extinction coefficient thereof, and d is a thickness of said second anti-reflection film.

8. The photomask according to claim 6, wherein said first anti-reflection film and a second anti-reflection film are comprised of at least one or a combination of two or more of LiF, MgF2, NaF, BaF2, CaF2, SrF2, PbF2, Al2F3, LaF3, YF3, ZnO, ZnS, ZrO, Al2O3, SiO2, TaO5, SiN and ITO.

9. The photomask according to claim 6, wherein said first anti-reflection film is a thin film of an organic substance, a main component of which includes at least one of carbon, oxygen, nitrogen and hydrogen.

10. The photomask according to claim 6, wherein said first anti-reflection film is a spin-on-glass film.

11. A photomask comprising:

a transparent substrate;

an anti-reflection structure having a chromium and chromium oxide laminated in order on a major surface of said transparent substrate;

a pellicle disposed apart from a surface of said anti-reflection structure by a predetermined distance and formed of a transparent member; and an anti-reflection film formed on a surface of said pellicle, wherein said anti-reflection film is comprised of at least one or a combination of two or more of LiF, MgF2, NaF, BaF2, CaF2, SrF2, PbF2, Al2F3, LaF3, YF3, ZnO, ZnS, ZrO, Al2O3, SiO2, SnO2, TaO5, SiN and ITO.

12. The photomask according to claim 11, wherein said anti-reflection film is formed on both a major surface and a bottom surface of said pellicle.

13. The photomask according to claim 11, wherein said anti-reflection film has the following properties:

1.0<n<2.4, k<0.5, and 0.01 $\mu$m<d<0.3 $\mu$m, where n is a relative refractive index with respect to air representing a complex refractive index at an exposure wavelength of said anti-reflection film, k is an extinction coefficient thereof, and d is a thickness of said anti-reflection film.

14. The photomask according to claim 11, wherein a main component of said anti-reflection film is a metallic element made of at least one of Au, Ag, Al, Pt, Sr, B, Ga, and In, or is made in which at least one of C, Si, Ge, Pb, P, As, Sb, Bi and H is doped.

15. The photomask according to claim 2, wherein said first and second anti-reflection films are comprised of at least one or a combination of two or more of LiF, MgF2, NaF, BaF2, CaF2, SrF2, PbF2, Al2F3, LaF3, YF3, ZnO, ZnS, ZrO, Al2O3, SiO2, SnO2, TaO5, SiN and ITO.

16. The photomask according to claim 15, wherein a main component of said first and second anti-reflection films is a metallic element made of at least one of Au, Ag, Al, Pt, Sr, B, Ga and In, or is made in which at least one of C, Si, Ge, Pb, P, As, Sb, Bi and H is doped.

17. The photomask according to claim 8, wherein a main component of said first and second anti-reflection films is a metallic element made of at least one of Au, Ag, Al, Pt, Sr, B, Ga and In, or is made in which at least one of C, Si, Ge, Pb, P, As, Sb, Bi and H is doped.

* * * * *